United States Patent [19]

Takano et al.

[11] Patent Number: 5,801,960

[45] Date of Patent: Sep. 1, 1998

[54] LAYOUT METHOD OF WIRING PATTERN FOR SEMICONDUCTOR INTEGRATED CIRCUIT

[75] Inventors: Midori Takano, Tokyo; Fumihiro Minami; Mutsunori Igarashi, both of Kanagawa, all of Japan

[73] Assignee: Kabushiki Kaisha Toshiba, Kawasaki, Japan

[21] Appl. No.: 963,311

[22] Filed: Nov. 3, 1997

Related U.S. Application Data

[63] Continuation of Ser. No. 452,087, May 26, 1995, abandoned.

[30] Foreign Application Priority Data

May 27, 1994 [JP] Japan ................... 6-114951

[51] Int. Cl.$^6$ ................................................ G06F 17/50
[52] U.S. Cl. .................... 364/491; 364/489; 364/490
[58] Field of Search ........................................ 364/491

[56] References Cited

U.S. PATENT DOCUMENTS

| | | | |
|---|---|---|---|
| 4,839,821 | 6/1989 | Murakata | 364/491 |
| 4,855,929 | 8/1989 | Nakajima | 364/490 |
| 5,225,991 | 7/1993 | Doughterty | 364/491 |
| 5,341,310 | 8/1994 | Gould et al. | 364/491 |
| 5,357,140 | 10/1994 | Kozasa | 257/752 |
| 5,557,779 | 9/1996 | Minami | 395/500 |
| 5,638,288 | 6/1997 | Deeley | 364/489 |

FOREIGN PATENT DOCUMENTS 5-3306   1/1993   Japan.
5-54100  3/1993   Japan.

OTHER PUBLICATIONS

Greenberg et al. ("Minimizing channel density with movable terminals", IEEE Comput. Soc. Press, Proceedings of the Third Great Lakes Symposium on VLSI Design Automation of High Performance VLSI Systems, 5 Mar. 1993, pp. 1–5).

Upton et al. ("Integrated placement for mixed macro cell and standard cell designs", IEEE, Proceedings of the 27th ACM/IEEE Design Automation Conference, 24 Jun. 1990, pp. 32–35).

Primary Examiner—Emanuel Todd Voeltz
Assistant Examiner—Phallaka Kik
Attorney, Agent, or Firm—Foley & Lardner

[57] ABSTRACT

A layout method of designing a wiring pattern on a semiconductor integrated circuit chip according to the present invention comprises three steps of omitting a part of or all of a wiring pattern within cells for a plurality of circuit elements for layout results of these predetermined circuit elements to prepare wiring obstruction data (step 1); deciding a specific wiring path connecting between the cells with reference to the prepared wiring obstruction data (step 2); and repositioning of the cell to correct the layout with no design rule violation and no short between this specific wiring path and the wiring pattern within cells (step 3). The pattern layout is performed so that the specific wiring path is wired in the shortest length of wiring path without making a snaking wire path and also uncomplete wiring does not happen to occur.

18 Claims, 10 Drawing Sheets

TERMINALS AND DESIGN RULE VIOLATION ON 2nd METAL LAYER 15

C2
2nd METAL LAYER WIRING 14
TERMINALS ON 1st METAL LAYER 16
C1

WIRING OBSTRUCTIONS ON 1st METAL LAYER

C2
MOVE
MOVE
2nd METAL LAYER WIRING 14
C1
C3
CELL OVERLAPPING

LAYOUT METHOD OF WIRING PATTERN FOR SEMICONDUCTOR INTEGRATED CIRCUIT

This application is a continuation of application Ser. No. 08/452,087, filed May 26, 1995 now abandoned.

BACKGROUND OF THE INVENTION

1. Field of the Invention

The present invention relates to a layout design of a semiconductor integrated circuit, and in particular to a design method of wiring in a Computer-Aided Design (CAD) processing.

2. Description of the Prior Art

A layout design of a semiconductor integrated circuit is composed of a design process of a cell placement and a design process of wiring between cells, and the design process is usually performed in this sequence. The design process of the cell placement is executed with several objects of minimizing estimated wire lengths and relaxing local congestions of wiring, so as to obtain higher wiring ability for cell interconnection. Also, in the design process of wiring between cells, the design of wiring is made so as not to short-circuit with wiring patterns within cells on the basis of the given cell position or to cause a violation of a design rule.

In particular, concerning an important signal for circuit operations such as a clock signal, wire length reduction or wire width widening are required in order to reduce the propagation delay time of a signal (hereinafter, simply called a delay time) and to prevent electro-migration failure. At the wiring with wide wire-width, no complete wiring path is found frequently, or even if it is found, a long snaking path is obtained. But, it is required for wiring to avoid the short to cell internal pins and wirings (obstructions). Such problems have been caused in the prior art.

As described above, in a conventional wiring method, the wiring patterns within cells have been position-fixed just after the design process of the cell placement, therefore a long snaking wiring, or a loop is frequently required in the next design process of wiring between the cells. This causes such problems that the signal delay time increases or other signal wiring is difficult to perform, or no complete wiring path is found in the worst case.

SUMMARY OF THE INVENTION

Accordingly, the present invention was invented in order to solve the above-mentioned problems of the prior art. It is an object of the present invention to provide a method of wiring a semiconductor integrated circuit having a desired wiring path and not causing incomplete wiring nor a snaking wiring path, for a wiring path for a specific signal line such as a clock signal line.

In order to achieve the above-mentioned objectives, the present invention is characterized, as shown in a flowchart of FIG. 1, in that placement results of a plurality of cells for circuit elements have previously and tentatively been determined to prepare wiring obstruction data (hereinafter, it may simply be referred to as obstructions) omitting a part of or all of wiring patterns within a predetermined cell with respect thereto, and in that a wiring path for a specific signal for connecting cells to each other is determined with reference to the prepared wiring obstruction data, and in that, in the case where a design rule violation or a short between the wiring path for this specific signal and the wiring pattern within cells is caused as shown in FIGS. 5, 7, 8, 9, this is removed by cell repositioning as shown in FIG. 12. Here, the wiring path for the specific signal means one that interconnect RC delay of an electric signal may be minimized and a length of wiring is not desired to increase by snaking wiring, or zigzag wiring etc. Namely, the wiring path for the specific signal means one that is so performed as to minimize a gate delay time of an semiconductor integrated circuit, and that considers metallurgical characteristics or electric characteristics such as an electro-migration and others.

Furthermore, the present invention is characterized, as shown in a flowchart of FIG. 10, in that there are provided three process steps as follows: Namely, after a wiring process for a specific signal is performed with respect to placement results of a plurality of cells for circuit elements that have previously and tentatively been determined, wiring obstruction data omitting a part of or all of wiring patterns within cells for circuit elements not connecting with the wiring for the specific signal and also capable of changing a cell position are prepared to search for and decide a wiring path for a specific signal with reference to the wiring obstruction data (step F1). In the case that there occurs a short or a design rule violation between the wiring path for the specific signal and the wiring pattern within cells for circuit elements not connecting with the specific signal, the cell is repositioned (step F2). In order to remove overlapping on other cells caused by this repositioning, other cell positions are further corrected (step F3).

In the step F2 as shown in FIG. 10, when a first cell (C1) causes an electrical short or a design rule violation between the wiring for the specific signal and the first cell (C1), the first cell (C1) is moved, or repositioned by the least distance in such a direction that the short or design rule violation can be removed as shown in FIG. 12, for example. This is because a new electrical short or a design rule violation between the wiring path for the specific signal and a cell is not caused. Further, when a new overlapping on a second cell (C3) occurs by this displacing process, the second cell (C3) is repeatedly moved by the least distance in such a direction that the overlapping on the first cell (C1) can be removed, so that a new short or design rule violation is not caused between the wiring for the specific signal and the second cell (C3) in the step F3 as shown in FIG. 13. Thus, a pattern design of an integrated circuit can be carried out.

In the event that a pattern design is carried out according to the flowchart as shown in FIG. 1 or 10, the design of wiring patterns can be carried out at a high speed without causing a long, roundabout circuit of the wiring path for the specific signal, and unconnecting.

Other and further objects and features of the present invention will become obvious upon an understanding of the illustrative embodiments about to be described in connection with the accompanying drawings or will be indicated in the appended claims, and various advantages not referred to herein will occur to one skilled in the art upon employing of the invention in practice.

DETAILED DESCRIPTION OF THE EMBODIMENTS

Figure 1:
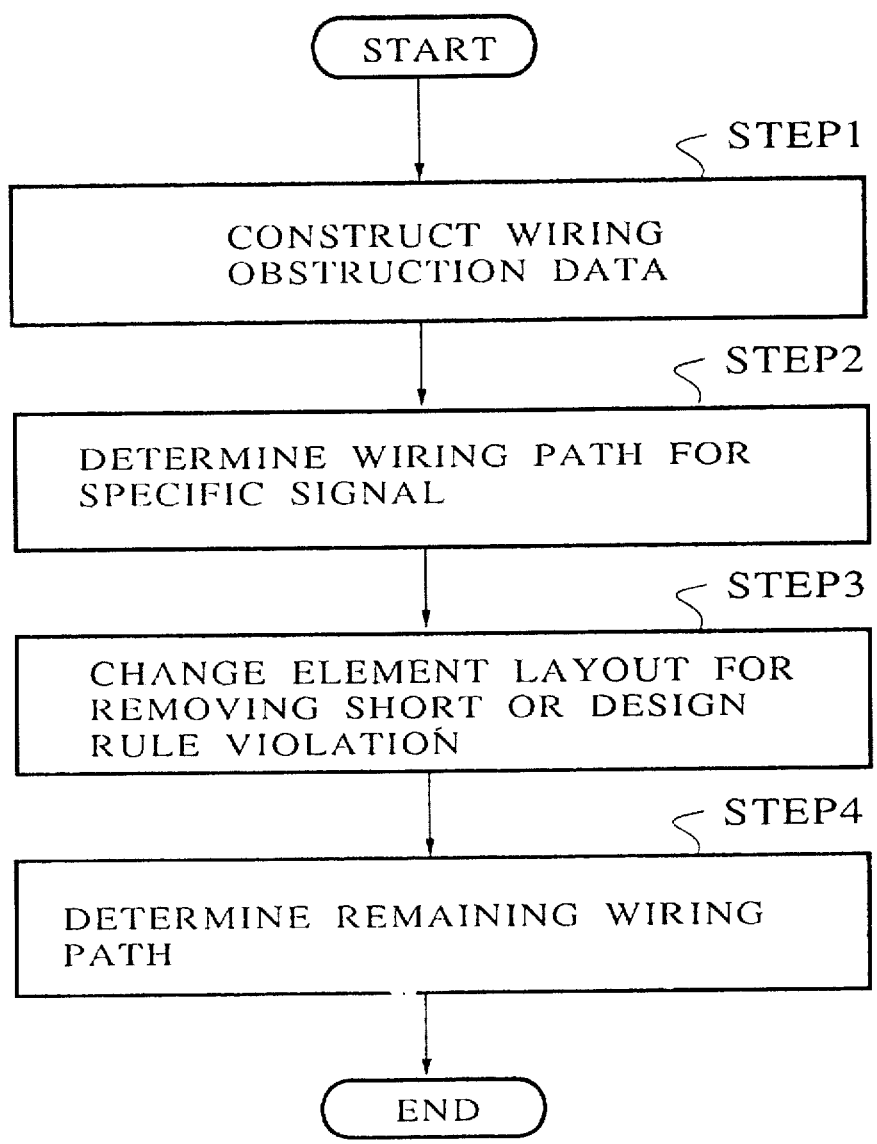
FIG. 1 shows a processual flowchart of a method of wiring a semiconductor integrated circuit according to a first embodiment of the present invention.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

FIG. 1 is a flowchart showing a processional procedure of a design process for wiring between cells of a semiconductor integrated circuit according to a first embodiment of the present invention. The processional procedure as shown in FIG. 1 comprises four process steps. In this connection, the design process of a cell layout has previously been performed prior to this process, and each cell layout position has once been decided.

In FIG. 1, wiring obstruction data for a layout process of a wiring path for a specific signal such as a clock signal, etc., are first constructed or prepared. In this preparing process, a part of or all of the wiring patterns within cells for a circuit element that is not connected to the specific signal, and that can change its position is omitted to form the wiring obstruction data. This process will be described in detail later on (step 1). Next, a wiring path for a specific signal is searched with reference to the wiring obstruction data (step 2). Hereinafter, "the wiring path for a specific signal" may be abbreviated and simply referred as a specific wire. Next, a cell causing a short between the cell and the specific wire determined in the step 2 or a design rule violation (wiring spacing error etc.) is found in order to move or reposition the cell position and transfer-correct another cell position in order to remove the overlapping caused by the displacement among cells. Whenever any cell-movement is carried out, the new position of the cell is selected near an original position (step 3). In this connection, this process will also be described in detail later on. Finally, as for an unwired portion of other wiring paths than the specific wire, or the wiring paths for remaining signals, taking into consideration all the wiring patterns within cells and all the wired patterns for each cell, these wiring paths are so determined as not to cause the short or design rule violation therein (step 4). The process in the step 4 may be similar to the process in the prior art.

Next, a method of forming wiring obstruction data in the step 1 will be explained. There are three sorts of registered patterns for the wiring obstruction data. One pattern is an already wired pattern for connecting cells to each other. We set the already wired pattern as a wiring obstruction (wire-inhibited region) as it is. Further, the two others are an internal wiring pattern in the cells that are position-fixed and an internal wiring pattern of the cells to be wired to the wiring path for a specific signal such as a clock signal etc. In this connection, regarding the cells that are not position-fixed cells, or that are not connected to the specific wire, or the wiring path for the specific signal, the wiring obstruction setting is not entirely performed for the internal wiring patterns in the cells. Alternatively the wiring obstruction setting is performed only for a metal wiring pattern on a specific layer such as a metal wiring pattern on a first layer etc.

Figure 2:
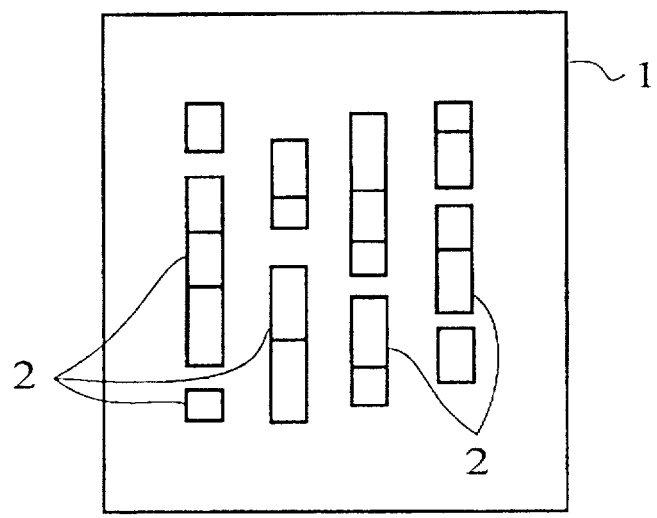
FIG. 2 shows a layout of a configurational example of a semiconductor integrated circuit pattern wired by the processional flowchart as shown in FIG. 1.
Figure 3:
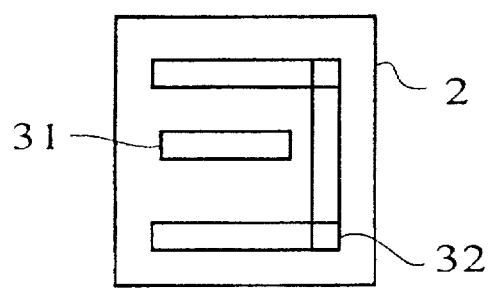
FIG. 3 shows a layout of an example of an internal terminal pattern of a cell as shown in FIG. 2.
Figure 4:
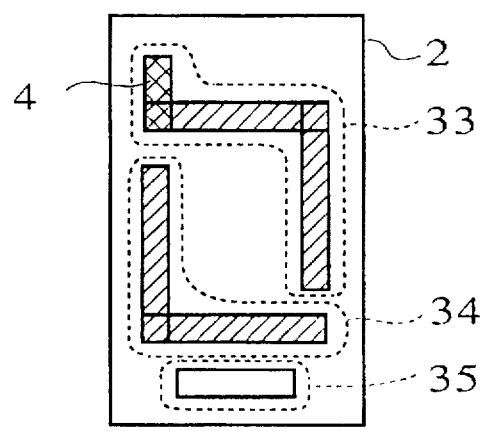
FIG. 4 shows an example of setting wiring obstruction data.

Successively, a concrete example of forming the wiring obstruction data with respect to an internal wiring pattern in the cells will be explained. FIG. 2 shows an example of a layout configuration of cells on a semiconductor integrated circuit chip. In FIG. 2, it is supposed that a column of cells 2 is arranged in a vertical direction to the chip 1, and that metal wiring on a first layer is performed in a vertical direction and metal wiring on a second layer is performed in a horizontal direction, respectively. Further, as for the cells 2 and a terminal within the cell 2, it is supposed that there are terminals that are electrically equivalent (equipotential) within the cell 2 as shown in FIG. 3, and that there further exist terminal rectangular sets 31, 32, each wiring layer on an upper layer corresponding to the respective terminals. At this time, with respect to the internal wiring pattern in the cell 2 connected to the wiring for the position-fixed cell 2 and the objective specific signal, namely the wiring that is not desired to perform a detour routing, setting is performed as a wiring obstruction as shown by a broken line of FIG. 4, for example.

Furthermore, in particular as for an input/output terminal in the internal wiring patterns of these cells 2, measures for not covering up the terminal with the wiring path for the specific signal are taken as follows: Namely, dummy wiring obstruction data are additionally prepared. As the result, the terminal rectangular sets 33, 34 on a first metal layer within the cells 2 are set as a wiring obstruction on the first metal layer with a rectangular pattern as they are, and also a specific portion on a second metal layer on its upper layer is set as a wiring obstruction to ensure a wiring lead-out. Namely, with respect to the terminal rectangular sets 33, 34 on the first metal layer, a terminal rectangle 4 having a shorter side length of the rectangle than a predetermined specific value in a direction perpendicular to a wiring direction of the second metal layer is selected from the terminal rectangular set 33. The second metal layer may be the wiring patterns on the first metal layer. And the terminal rectangle 4 having the same shape as the first metal layer is additionally and hypothetically prepared as wiring obstruction data on the second metal layer. By doing so, it is possible to assure the path for the wiring lead-out from the terminal of the first metal layer in the roundabout path-enabled wiring process, namely the wiring process for the regular signal. However, when the wiring for the regular signal to the terminal is performed in the process of step 4 as shown in FIG. 1, the wiring obstruction data that have been imagined and additionally prepared in the step 1 are ignored.

Figure 5:
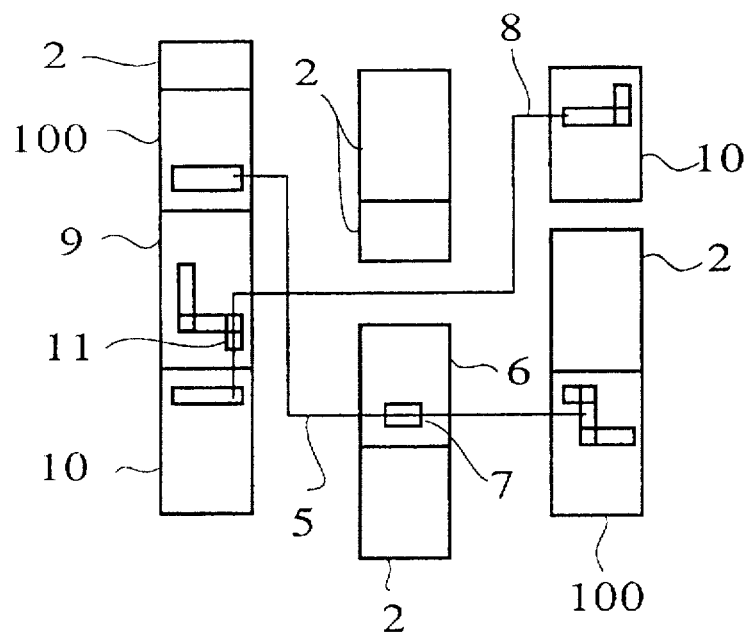
FIG. 5 shows a layout of a wiring example wired by the processional flowchart as shown in FIG. 1 according to the first embodiment of the present invention.

FIG. 5 shows an embodiment of a layout where a wiring process is performed in step 2 as shown in FIG. 1 for the above-mentioned obstruction setting. Here, it is assumed that cells 10, 100 are fixed in placed and cells 2, 6, 9 can be movable. In FIG. 5, a wiring path 5 for a specific signal, or the specific wire 5, is electrically shorted with a terminal rectangle 7 within the cell 6, and the cell 6 is a cell that can be moved, and it is possible to remove the short by the movement of the cell 6. Further, a metal wire on a first layer passes above the inside of the movable cell 9 and the inside of the fixed-placed cell 10, and a wiring path 8 for a specific signal, or the specific wire 8, is electrically shorted with a terminal rectangle 11 of the cell 9 on the first metal layer. In this embodiment, it is possible to remove the short with the terminal rectangle 11 by the repositioning of the cell 9. Thus, with respect to the cell that is not connected to the specific wires 5, 8, and that can change its position, even if wiring patterns within the cells are actually electrically shorted, it is possible to remove the short circuit between the wiring pattern and the specific wires 5, 8 by the repositioning of the cell. However, supposing a moving destination of the cell is in the vicinity of an original position, in order to completely remove such electrically shorted portion, it is necessary that the short circuit of wiring should not intensively be caused in a local portion on a semiconductor chip.

Figure 6:
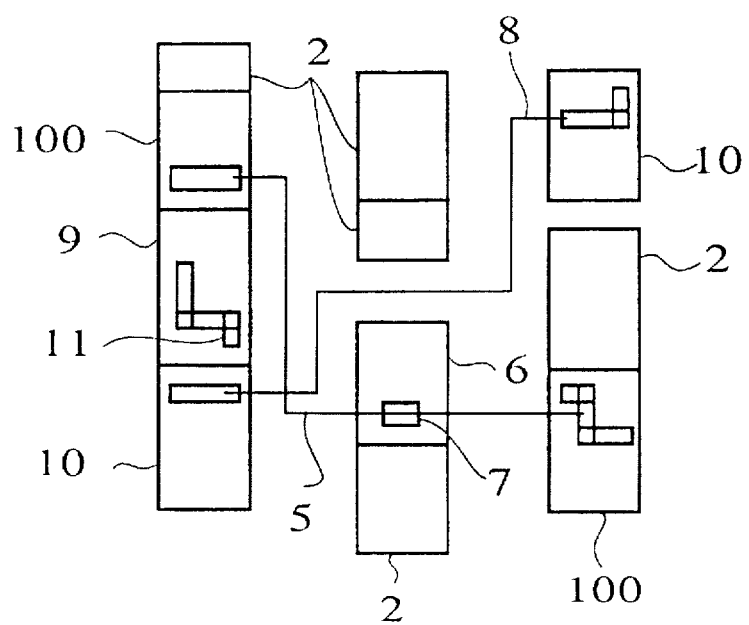
FIG. 6 shows a layout of an example of wiring results in the case where a wiring obstruction on a first metal layer is changed in setting with respect to a wiring example as shown in FIG. 5.

Furthermore, the metal wiring on the first layer is frequently used for the actual wiring patterns within a cell, and in particular in many cases, the wiring path for a power supply penetrates inside a cell column with the metal wiring on the first layer. In this case, other devices are further required. Namely, since the cells cannot be moved to any portion other than the cell column and it is easy to be electrically shorted between the specific wire and the metal wiring on the first layer inside the cell column with relative-higher probability. In some cases, there cannot be found the appropriate moving destination of the cell position so as to remove a short in the above-mentioned method. Accordingly, it is material that the metal wiring path on the first layer for a specific signal should be restricted inside the cell column. As a specific example for this restriction, the following method is proposed. Namely, with respect to the cell 2 that is not connected to the specific wire 8, and that can change a layout position, the entire area of cells is set as a wiring obstruction of the metal wiring on the first layer. By doing so, the electrically shorted specific wire 8 as shown in FIG. 5 is changed to a wiring path as shown in FIG. 6, and the specific wire 8 is not subjected to a prevention by the wiring within the cell column in the cell moving process. Then, in the step 2 as shown in FIG. 1, only the wiring obstruction data prepared are assumed as obstructions when processing to search the wiring path for a specific signal with a designated wiring width.

Next, the process to be performed in step 3 after wiring processing in step 2, namely a method of correcting the design rule violation or a method of removing the short between the wiring and wiring pattern within cells, will be explained. First, for the results of the given cell placement, the design rule violation etc. resulted in the wiring processing will be explained. In this case, the wiring pattern layout within cells is assumed to be prescribed according to library information for each circuit element type. The short between the wiring pattern within cells or a design rule violation is caused in the case that the wire passes on the cell and the wiring pattern within cells on the path of the wire is on the same layer. Alternatively, the short or the design rule violation is caused by such situation that the predetermined spacing distance is not held between the wire and the wiring pattern within cells. Specifically, the following embodiments of short circuits and design rule violations, which should be removed in step 3, are shown.

Figure 7:
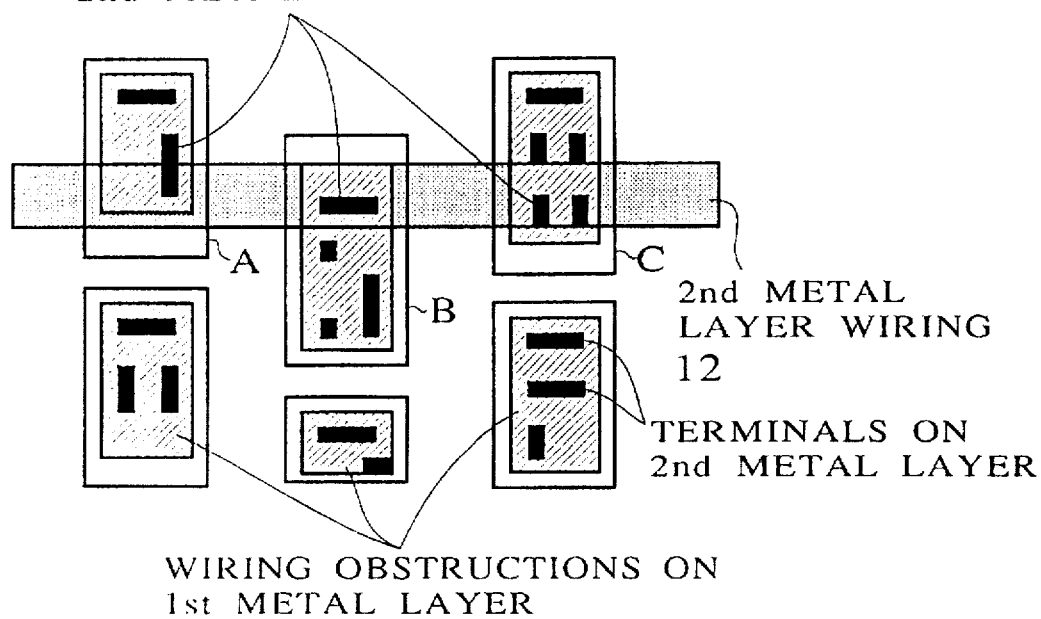
FIG. 7 shows a layout of an example of an electrical short between a wiring path for a specific signal and wiring patterns within cells.

(i) FIG. 7 shows the mutual relationship between wiring obstructions on a second metal layer and metal wirings on a second layer. The wiring obstructions include terminals on a second metal layer. Namely, in FIG. 7, when a metal wire 12 on a second layer passes over cells A, B, C, shorts are caused at three portions, since the metal wire 12 passes over wiring patterns (terminals on a second metal layer) 13 within cells A, B, C on the second layer.

Figure 8:
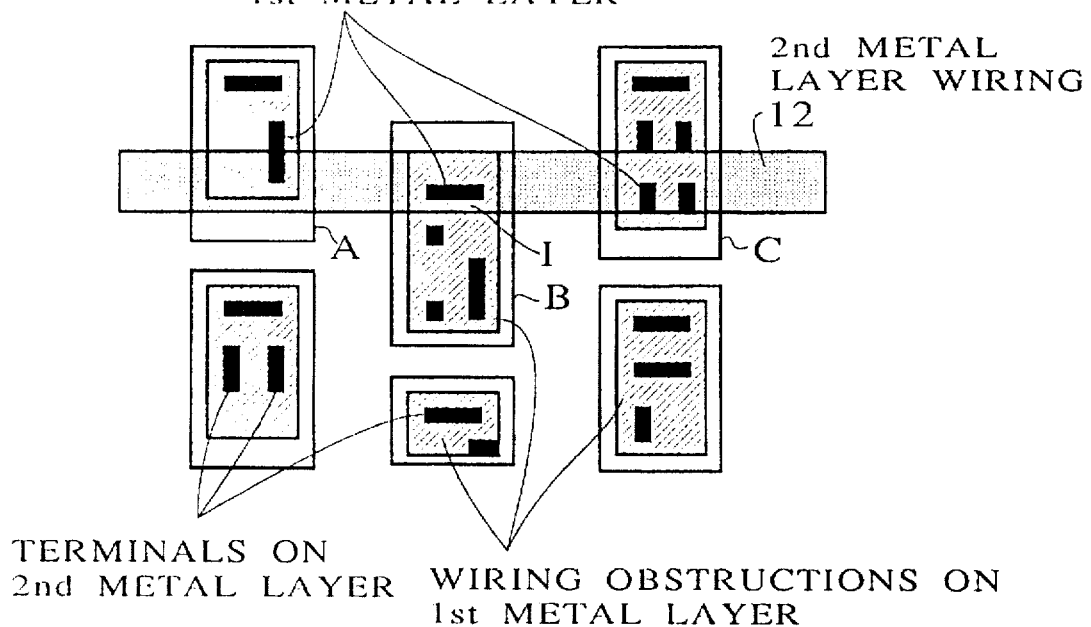
FIG. 8 shows a layout of an example where a wire cannot be connected to a terminal to be connected with another wire due to block-up by a wiring path for a specific signal.

(ii) Furthermore, FIG. 8 shows the relationship between terminals on a first metal layer and a metal wiring on a second layer. Namely, in the pattern layout as shown in FIG. 8, since terminal I on a first metal layer to be connected to a predetermined wiring is blocked up by other obstacles on a first metal layer and the wire 12 on a second metal layer, the terminals cannot be connected to the wiring. Namely, in FIG. 8, when the metal wiring 12 on the second layer passes through the cell B, as the terminal on the second layer does not exist, the design rule violation is not caused on the second layer. However, since the terminal I of the cell B is surrounded by the wiring obstacles, or the wiring obstructions on the first metal layer, and simultaneously the upper part of the terminal I is covered by the wiring metal 12 on the second metal layer, the terminal I of the element B cannot be wired. In short, the terminal I is not accessible from outside. This situation is interpreted as a short in a broad sense, and the terminal I is regarded as an obstacle on a first metal layer with respect to the metal wiring 12 on the second layer. And a rectangle having the same shape as the terminal I is additionally and imaginarily prepared as a wiring obstruction on a second metal layer.

Figure 9:
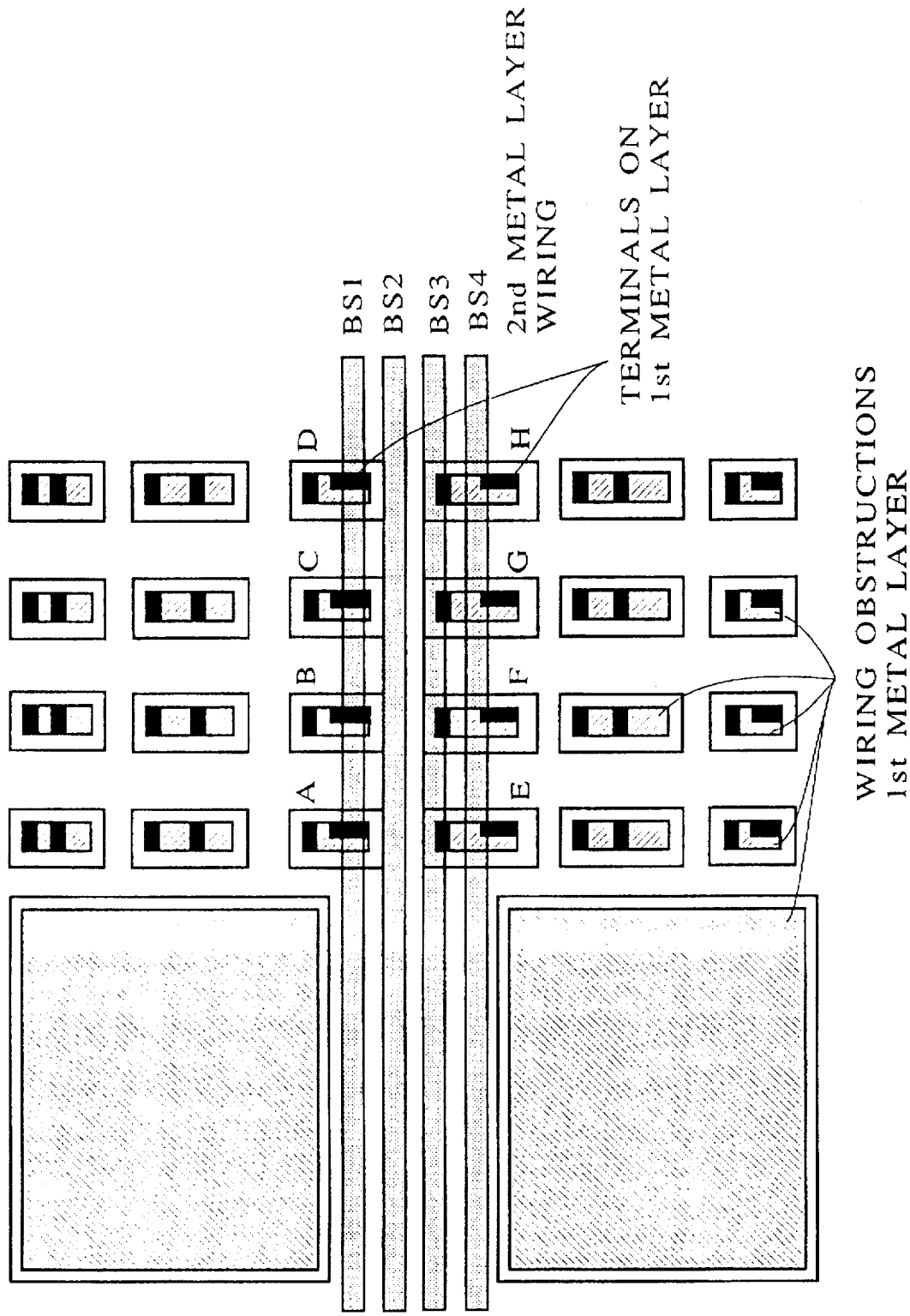
FIG. 9 shows a layout of an example in the case where a wiring design to be successively performed becomes difficult due to the existence of bus lines.

(iii) The pattern layout as shown in FIG. 9 indicates such a case that, as bus lines exist, it becomes difficult to successively design a wiring path. In this layout examples, bus lines BS1, BS2, BS3, BS4 are wired and the design rule violation does not occur. However, when wirings for cells A to H are to be performed, such a region in the vicinity of the bus lines BS1, BS2, . . . , BS4 causes local wiring congestion. That is, there remains very limited area that can be used for wiring under the bus wires BS1, BS2, . . . BS4, and the congestion or crowding of wirings will occur. Accordingly, even in the layout pattern as shown in FIG. 9, the layout situation around the bus lines should be recognized as a design rule violation to be solved in a broad sense.

Figure 10:
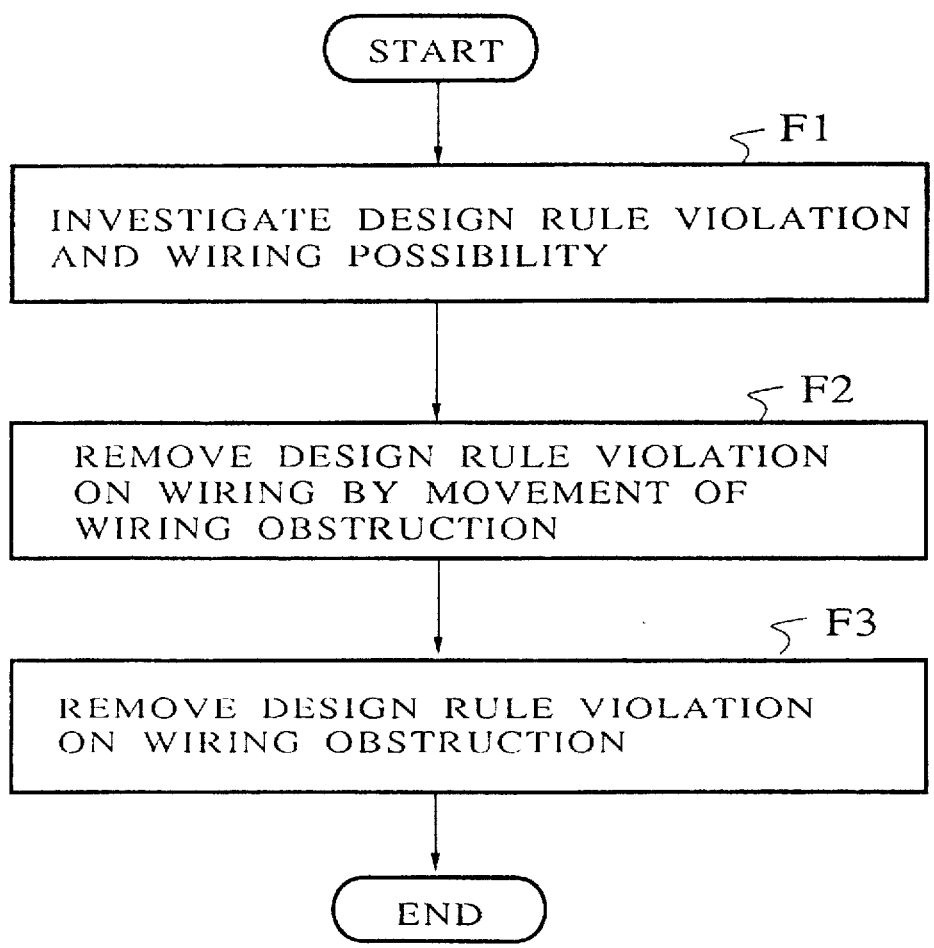
FIG. 10 shows a processional flowchart for removing a design rule violation in a method of wiring a semiconductor integrated circuit according to a second embodiment of the present invention.

FIG. 10 shows a flowchart of a process procedure in a method of removing a design rule violation according to a second embodiment of the present invention. Namely, a detailed flowchart in step 3 of the flowchart as shown in FIG. 1 is shown in FIG. 10. The method of removing the design rule violation according to the second embodiment of the present invention contains a process of recognizing portions of the design rule violation (step F1); a process of removing the portions of the design rule violation, or removing a short between a specific wire and a pattern within cells etc., and moving cells with their wiring obstructions which are obstacles for the specific wire which should not have a serpentine path (step F2); and a process of removing the design rule violation newly occurred in the step F2, such as the design rule violation caused by an overlapping between a displaced obstacle and another fault etc. (step F3).

Figure 11:
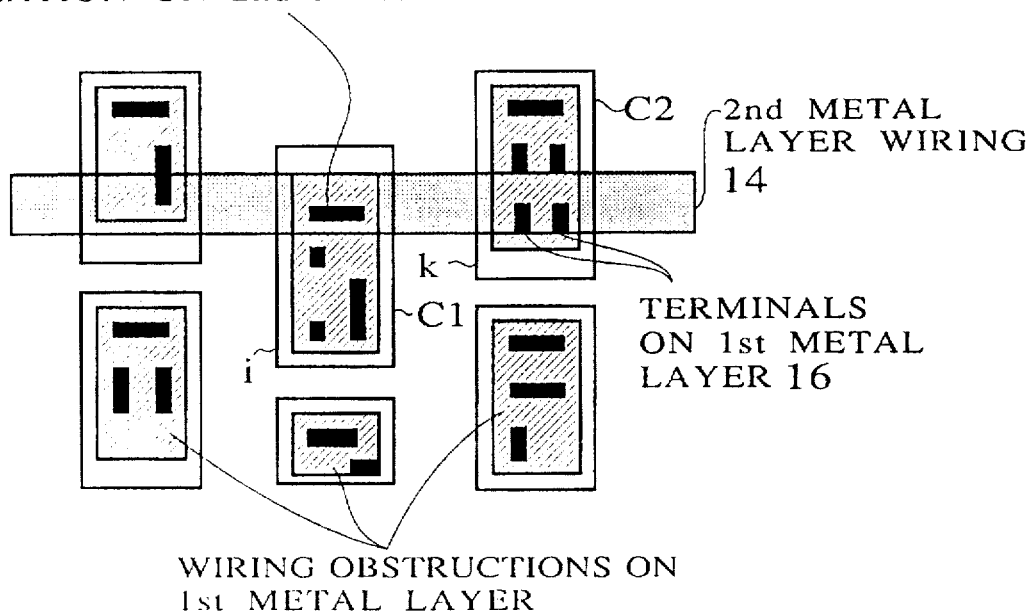
FIG. 11 shows a layout of an example of the design rule violation caused between a wiring obstruction and wiring path for a specific signal detected in step F1 as shown in FIG. 10.

(a) FIG. 11 shows a layout of cells as an example of a design rule violation that occurred between obstacles detected in step F1 as shown in FIG. 10. In FIG. 11, a specific wire 14 being a wire on a second metal layer is electrically shorted with an intracell terminal 15 on the second layer on a cell C1. Here we refer to the terminal within the cell as an intracell terminal. A metal terminal 16 in the cell C2 on a first layer is not approached by another wire, or the extracting path from the cell C2 is prohibited over the area of cell C2.

Figure 12:
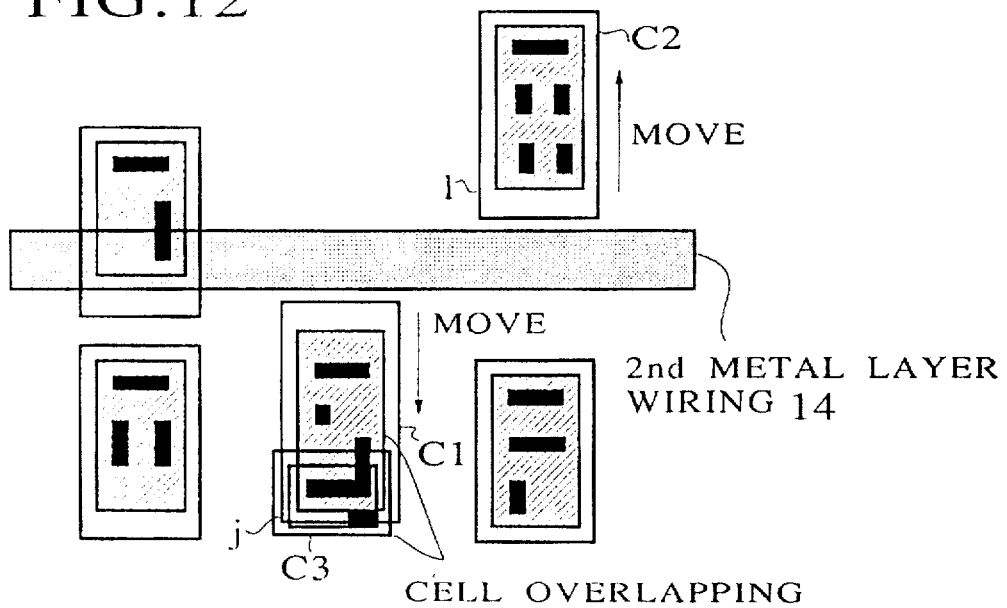
FIG. 12 shows a layout of such a situation where the design rule violation detected in step F1 is removed in step F2.

(b) FIG. 12 shows such a process where the design rule violation detected in the step F1 shown in FIG. 10 is removed by the process in step F2. Namely, in the case where the design rule violations have occurred in cells C1, C2 on the position i, k, respectively, the movable cells C1, C2, which are set as wiring obstructions, are moved from their current positions i, k as shown in FIG. 11 to positions J, l in the vicinity thereof as shown in FIG. 12. As a result, it is possible to remove the design rule violation etc. which occurred between the specific wire 14 on the second layer and the wiring obstruction on the second layer. A location selected as a moving destination J of the cell C1 is one where a new design rule violation does not occur between the cell C1 and the specific wire 14. However, as shown in FIG. 12, just after the process as shown in the step F2, an overlapping between the cell C1 and the other cell C3 or other wiring obstruction is allowed to occur in the step F2.

Figure 13:
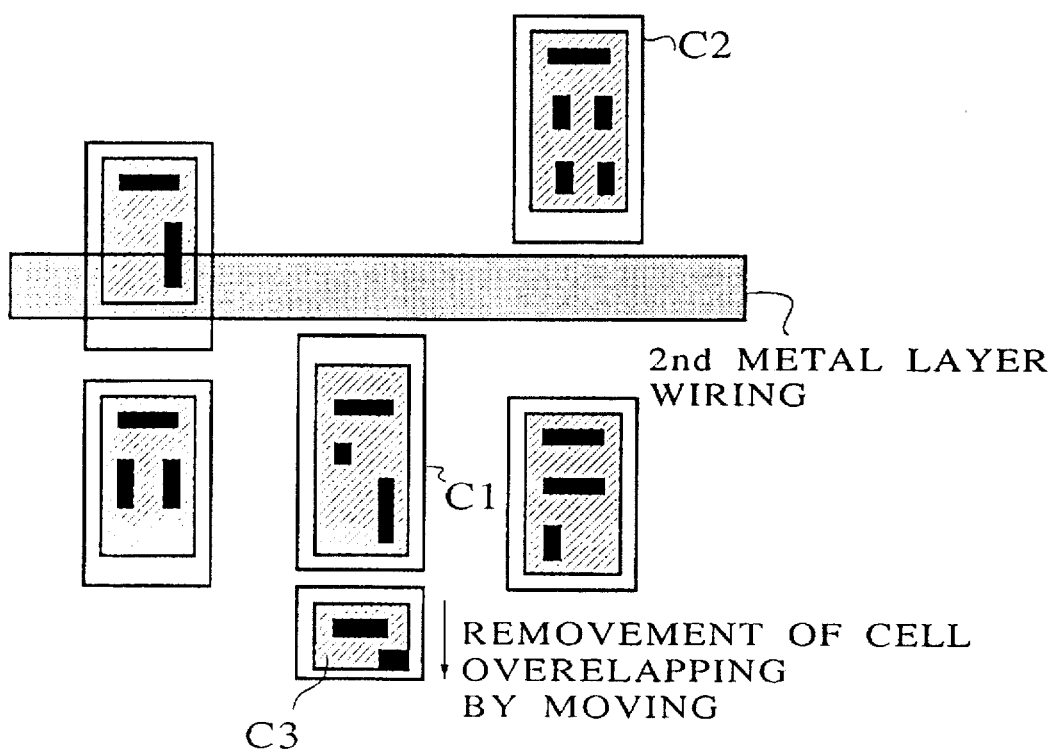
FIG. 13 shows a layout of an example obtained after overlapping between a wiring obstruction newly occurring in the step F2 and another cell or wiring obstruction is removed in step F3.

(c) In step F3, as shown in FIG. 13, the overlapping created in the step F2, or the overlapping between the moved wiring obstruction C1 and the other cell C3 or other wiring obstruction is removed. In the step F3, the overlapped wiring obstruction is moved to a neighboring position, whereby the design rule violation such as the overlapping between the cell and the wiring obstruction or between the cell etc. can be removed to obtain the results of no design rule violations. Further, in connection with the cell movement, there is provided an index monitoring mechanism for an increase in a wiring length of each net or a half perimeter of each net span so that facilitation of connecting wiring to other cells cannot be damaged. And the wiring obstruction or cell having a lower value of the increment in the index thus monitored is processed on preferential basis.

Figure 14:
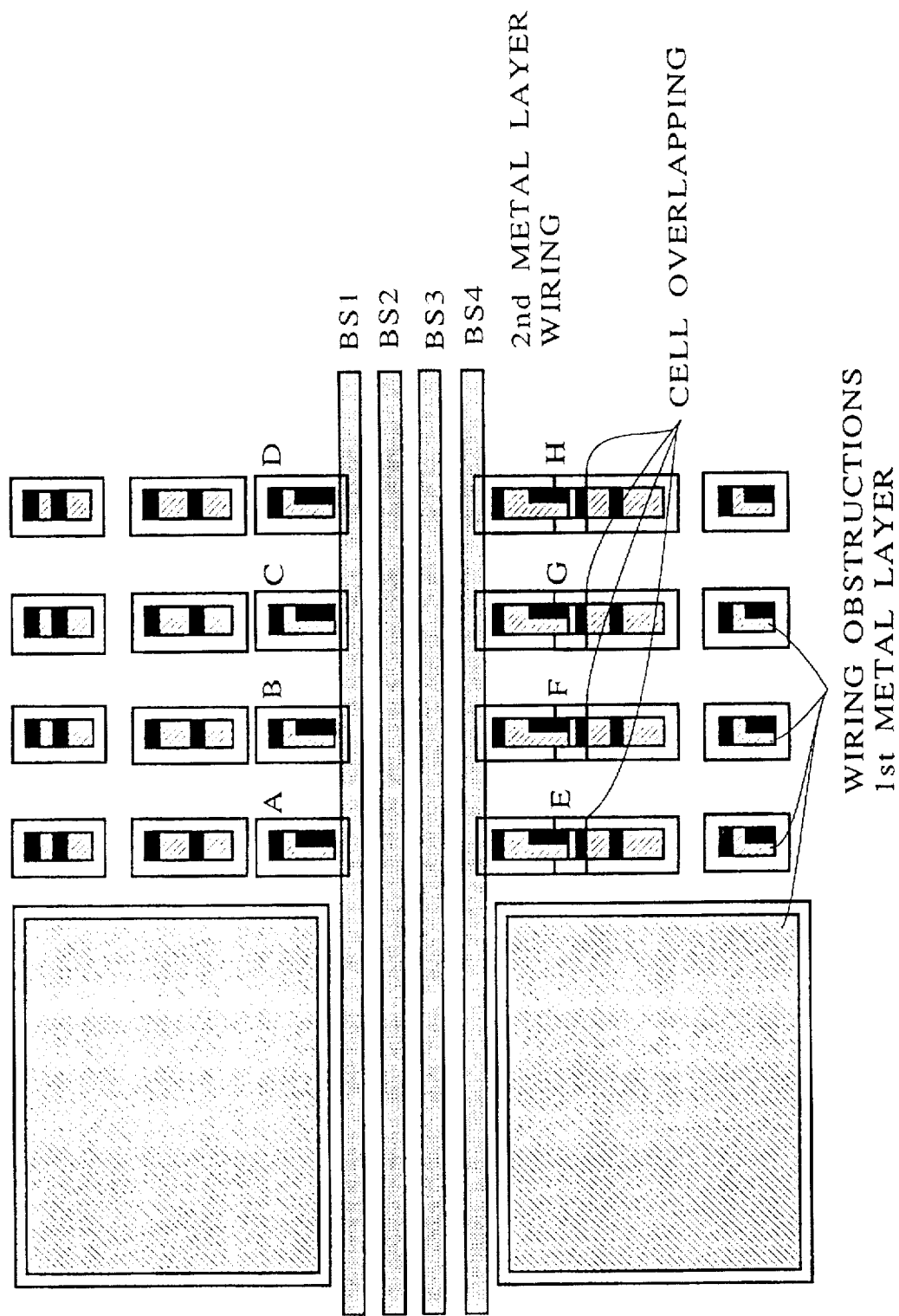
FIG. 14 shows a layout of such a result where a cell on a bus lines path is repositioned in the step F2 as shown by FIG. 10.
Figure 15:
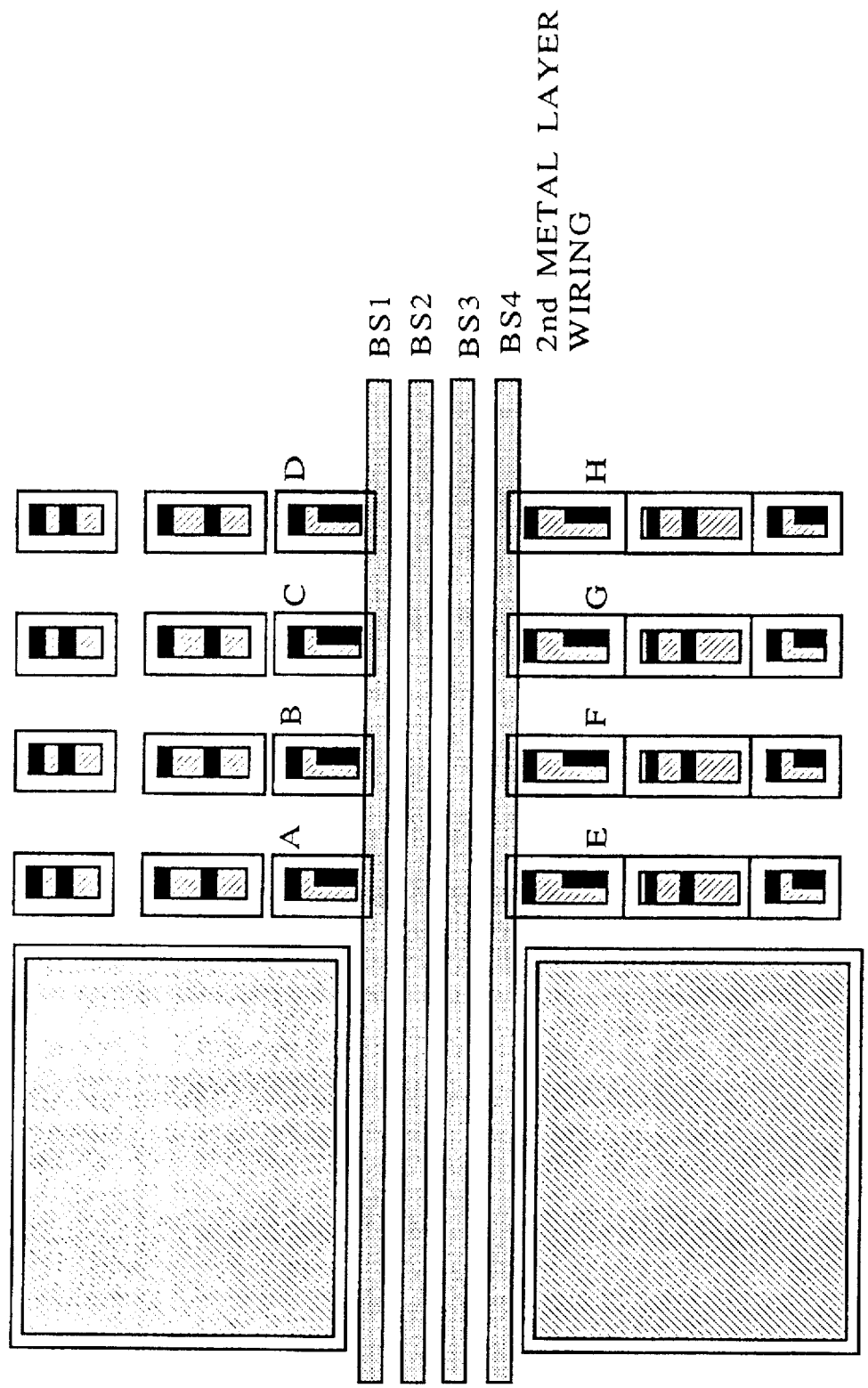
FIG. 15 shows a layout of a situation where overlapping between the cell repositioned in the step F2 and another cell is removed in step 3.

The second embodiment of the present invention can be applied to the case that, as bus lines exist, it becomes difficult to perform the following wiring layouts. FIG. 14 shows results obtained by moving cells on bus lines paths in the step F2. FIG. 15 shows a situation which appeared after the overlapping removal process in the step F3, in which the overlappings between the cells moved in the step F2 and other cells E, F, G, H are removed by the rearrangement of cells.

As described in detail above, in the present invention, the setting number of wiring obstruction is reduced for the layout of the specific wire, which should avoid the snaking wiring path. Hence, it becomes easy to search the wiring path for the specific wire, and incomplete wiring or snaked wiring rarely occurs. Accordingly, the wire length for a specific signal is reduced, thereby to shorten the delay time of a signal and effectively make use of a wiring resource. Further, since the amount of obstruction data is reduced, the amount of memory usage for the wiring process is decreased, and also the path search is carried out quickly, whereby it is possible to reduce a wiring process time as ⅛ times short as the interval of the prior art. Further, since a length of wiring is shortened, it is possible to enhance metallurgical and electric characteristics of wiring, as well as the electric characteristics of the semiconductor integrated circuit. Namely, the shortened wiring path can improve the switching speed of the integrated circuit.

What is claimed is:

1. A layout method of a circuit pattern for a semiconductor integrated circuit (IC), comprising the steps of:
   (a) a first step of laying out cells by tentatively placing a plurality of movable cells and permanently fixing a plurality of immovable cells, in predetermined positions, each movable and immovable cell having an internal wiring pattern for forming a circuit element, respectively;
   (b) a second step of preparing wiring obstruction data for searching a wiring path for a specific signal with respect to the cell layout results of said first step, comprising including in the obstruction data the internal wiring patterns of said immovable cells and including only a portion or none of the internal wiring patterns of said movable cells;
   (c) a third step of searching and fixing the wiring path for the specific signal with reference to the prepared wiring obstruction data so as to avoid design rule violations in said immovable cells while enabling the wiring path to pass through said immovable and movable cells;
   (d) a fourth step of removing any short circuit between said wiring path and said internal wiring pattern in one or more of said movable cells or removing design rule violations by repositioning corresponding ones of said movable cells; and
   (e) a fifth step of deciding wiring paths of remaining signals.

2. A layout method as claimed in claim 1, wherein
   in said second step, all of the internal wiring patterns within said movable cells laid out in said first step are omitted to prepare said-wiring obstruction data.

3. A layout method as claimed in claim 1, wherein
   the wiring path for said specific signal is one for a signal whose electric characteristics should be taken into consideration, and the number of snaking portions in the wiring path for the specific signal decided in said third step are minimized.

4. A layout method as claimed in claim 1, wherein
   in said second step, at least a part of the internal wiring patterns of said movable cells which are not connected to the wiring path for the specific signal, and which can be repositioned are omitted to prepare the wiring obstruction data.

5. A layout method as claimed in claim 1, wherein said fourth step, comprises:

a repositioning of a first movable cell which has a design rule violation or a short circuit between the internal wiring pattern in said first movable cell and the wiring path for the specific signal by a minimum distance in a direction capable of removing the design rule violation or the short circuit and a repositioning of a second movable cell by a minimum distance in a direction capable of removing an overlapping between the first and second movable cells so that a new design rule violation or a new short circuit between the internal wiring pattern in the second movable cell and the wiring path for the specific signal is not caused.

6. A layout method as claimed in claim 4, wherein the internal wiring patterns in the first and second movable cells are not connected with the wiring path for the specific signal.

7. A layout method as claimed in claim 2, wherein said fourth step comprises:

a repositioning of a first movable cell having a design rule violation or a short circuit between the internal wiring pattern in the first movable cell and the wiring path for the specific signal by a minimum distance in a direction capable of removing the design rule violation or the short circuit; and a repositioning of a second movable cell by a minimum distance in a direction capable of removing an overlapping between the first and second movable cells so that a new design rule violation or a new short circuit between the internal wiring pattern in the second movable cell and the wiring path for the specific signal is not caused.

8. A layout method as claimed in claim 3, wherein said fourth step comprises:

a repositioning of a first movable cell having a design rule violation or a short circuit between the internal wiring pattern in the first movable cell and the wiring path for the specific signal by a minimum distance in a direction capable of removing the design rule violation or the short circuit; and a repositioning of a second movable cell by a minimum distance in a direction capable of removing an overlapping between the first and second movable cells so that a new design rule violation or a new short circuit between the internal wiring pattern in the second movable cell and the wiring path for the specific signal is not caused.

9. A layout method as claimed in claims 4, wherein said fourth step comprises:

a repositioning of a first movable cell having a design rule violation or a short circuit between the internal wiring pattern in the first movable cell and the wiring path for the specific signal by a minimum distance in a direction capable of removing the design rule violation or the short circuit; and a repositioning of a second movable cell by a minimum distance in a direction capable of removing an overlapping between the first and second movable cells so that a new design rule violation or a new short circuit between the internal wiring pattern in the second movable cell and the wiring path for the specific signal is not caused.

10. A layout method as claimed in claim 9, wherein the internal wiring patterns in the first and second movable cells are not connected with the specific signal.

11. A layout method as claimed in claim 1, wherein said semiconductor integrated circuit has a first metal layer, and a second metal layer disposed over the first metal layer, and said wiring path for the specific signal comprises wiring formed in the second metal layer.

12. A layout method as claimed in claim 11, wherein said internal wiring patterns are formed at least in the first metal layer.

13. A layout method as claimed in claim 12, wherein said internal wiring patterns are formed partially in the second metal layer.

14. A layout method as claimed in claim 1, wherein said wiring obstruction data comprises:

the internal wiring patterns in said immovable cells; and the internal wiring patterns to be wired to said wiring path for the specific signal.

15. A layout method as claimed in claim 14, wherein said wiring obstruction data further comprises an already wired pattern for connecting cells.

16. A layout method as claimed in claim 13, wherein said wiring obstruction data is limited to wiring patterns formed as the first metal layer.

17. A layout method as claimed in claim 13, wherein a dummy internal wiring pattern is additionally prepared as the second metal layer and is included as the wiring obstruction data to ensure a wiring lead-out, the dummy internal wiring pattern being removed after said fourth step so as not to exist as a real circuit pattern.

18. A layout method as claimed in claim 17, wherein said dummy internal wiring pattern has a same rectangular shape as a terminal rectangle on the first metal layer having a shorter side length than a predetermined value in a specific direction.

* * * * *